(12) United States Patent
Hatsuda

(10) Patent No.: US 11,386,944 B2
(45) Date of Patent: Jul. 12, 2022

(54) MEMORY DEVICE WITH SWITCHING ELEMENT CONNECTED IN SERIES TO RESISTANCE CHANGE MEMORY ELEMENT

(71) Applicant: KIOXIA CORPORATION, Tokyo (JP)

(72) Inventor: Kosuke Hatsuda, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/821,510

(22) Filed: Mar. 17, 2020

(65) Prior Publication Data

US 2021/0090629 A1 Mar. 25, 2021

(30) Foreign Application Priority Data

Sep. 19, 2019 (JP) .............................. JP2019-170313

(51) Int. Cl.
*G11C 11/16* (2006.01)
*H01L 43/02* (2006.01)
*H01L 27/22* (2006.01)

(52) U.S. Cl.
CPC ........ *G11C 11/1659* (2013.01); *G11C 11/161* (2013.01); *G11C 11/1655* (2013.01); *G11C 11/1657* (2013.01); *G11C 11/1673* (2013.01); *H01L 27/224* (2013.01); *H01L 43/02* (2013.01)

(58) Field of Classification Search
CPC .............. G11C 11/1659; G11C 11/161; G11C 11/1655; G11C 11/1657; G11C 11/1673; G11C 13/0002
See application file for complete search history.

(56) References Cited

U.S. PATENT DOCUMENTS

| | | | |
|---|---|---|---|
| 8,009,484 B2 | 8/2011 | Furuta et al. | |
| 9,058,884 B2 | 6/2015 | Ueda | |
| 10,127,960 B1* | 11/2018 | Nobunaga | G11C 11/1693 |
| 10,157,655 B2 | 12/2018 | Fujino et al. | |
| 10,388,345 B2 | 8/2019 | Hatsuda et al. | |
| 10,431,277 B2 | 10/2019 | Hatsuda et al. | |
| 2006/0092734 A1 | 5/2006 | Tsuchida et al. | |
| 2013/0229861 A1 | 9/2013 | Ueda | |
| 2014/0241075 A1* | 8/2014 | Jeon | G11C 13/0004 365/189.09 |
| 2018/0268897 A1* | 9/2018 | Ueda | G11C 11/1677 |

(Continued)

FOREIGN PATENT DOCUMENTS

| | | |
|---|---|---|
| JP | 2006127672 A | 5/2006 |
| JP | 2010055692 A | 3/2010 |

(Continued)

*Primary Examiner* — Alfredo Bermudez Lozada
(74) *Attorney, Agent, or Firm* — Holtz, Holtz & Volek PC

(57) ABSTRACT

According to one embodiment, a memory device includes first and second wiring lines, a memory cell connected between the first and second wiring lines and including a resistance change memory element and a switching element connected in series to the resistance change memory element, and a determination circuit determining a determination object resistance state set in advance to the resistance change memory element based on a determination object voltage applied to the second wiring line when the switching element makes a transition from an on-state to an off-state.

19 Claims, 10 Drawing Sheets

(56) References Cited

U.S. PATENT DOCUMENTS

| | | | |
|---|---|---|---|
| 2018/0277171 A1* | 9/2018 | Matsuoka | G11C 5/14 |
| 2019/0088298 A1 | 3/2019 | Hatsuda et al. | |
| 2019/0148455 A1* | 5/2019 | Hong | H01L 45/146 |
| | | | 257/4 |
| 2020/0302989 A1 | 9/2020 | Osada et al. | |

FOREIGN PATENT DOCUMENTS

| | | |
|---|---|---|
| JP | 2013196730 A | 9/2013 |
| JP | 2019057348 A | 4/2019 |

\* cited by examiner

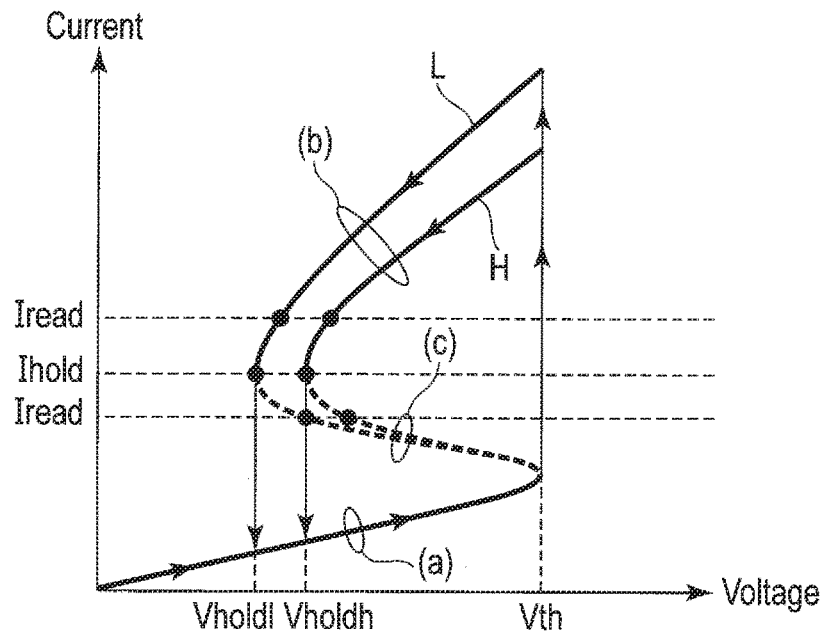
F I G. 6
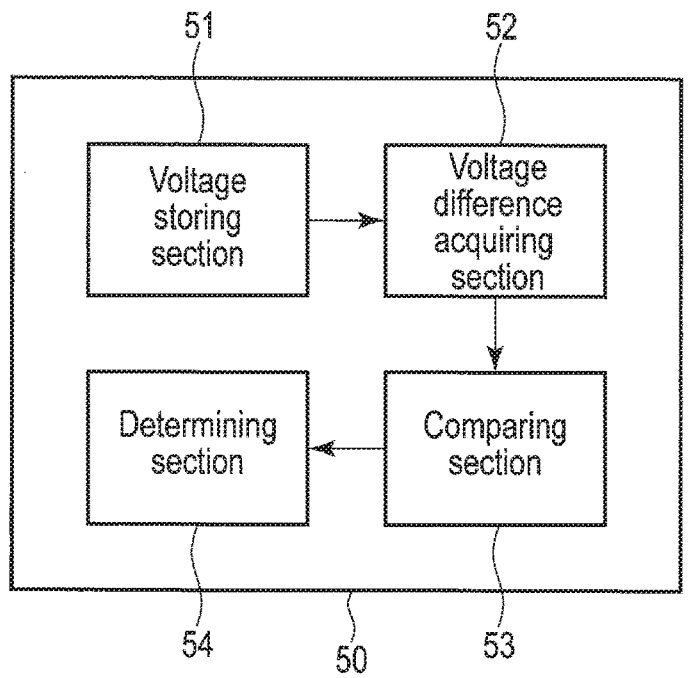
F I G. 7

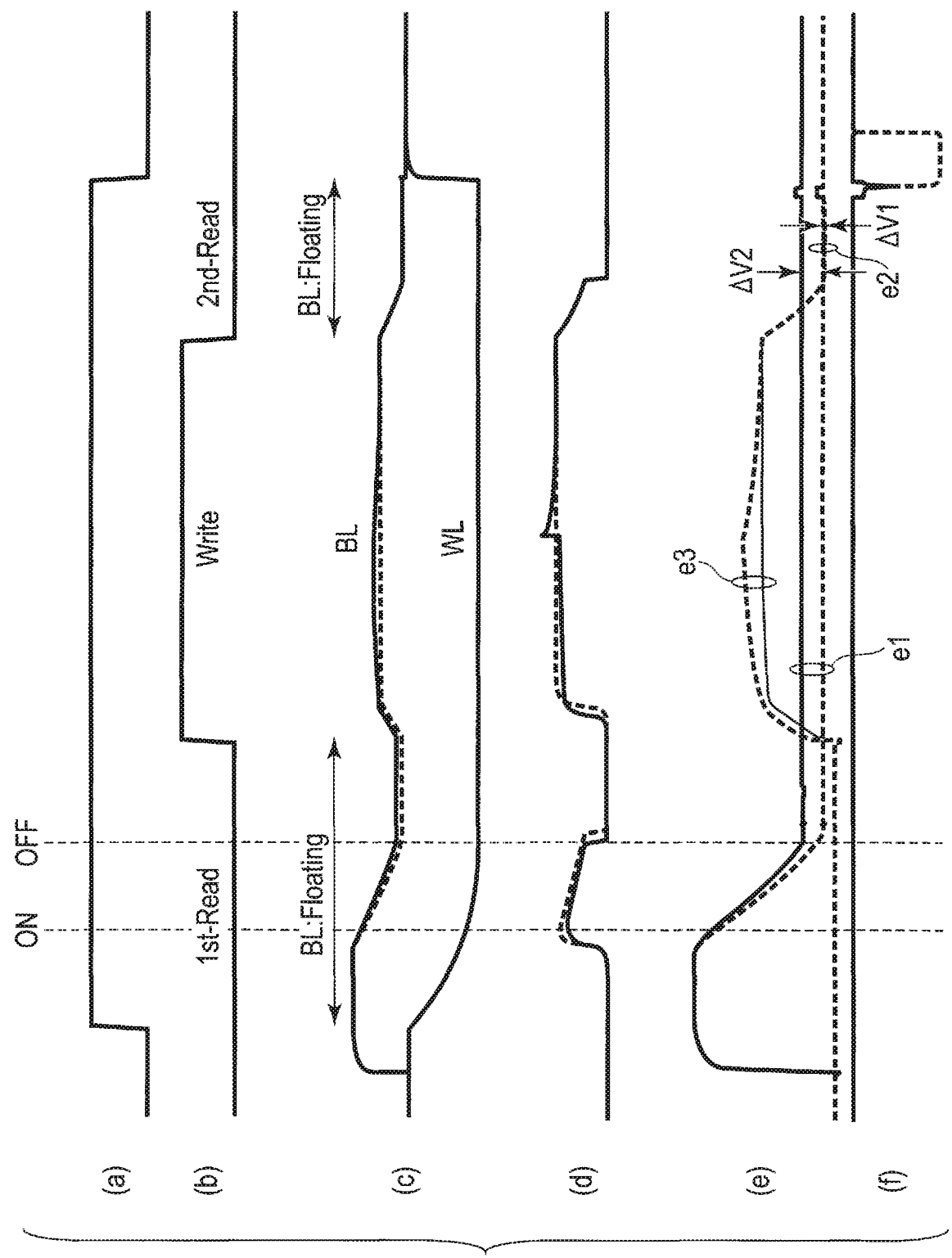
F I G. 9

MEMORY DEVICE WITH SWITCHING ELEMENT CONNECTED IN SERIES TO RESISTANCE CHANGE MEMORY ELEMENT

CROSS-REFERENCE TO RELATED APPLICATIONS

This application is based upon and claims the benefit of priority from Japanese Patent Application No. 2019-170313, filed Sep. 19, 2019, the entire contents of which are incorporated herein by reference.

FIELD

Embodiments described herein relate generally to a memory device.

BACKGROUND

A memory device in which resistance change memory elements and the like are integrated on a semiconductor substrate is proposed.

BRIEF DESCRIPTION OF THE DRAWINGS

FIG. 6 is a view schematically showing the current-voltage characteristics at the time of read of the memory cell included in the memory device according to the first embodiment.

FIG. 7 is a block diagram showing the functional configuration of a determination circuit included in the memory device according to the first embodiment.

FIG. 9 is a view showing a simulation result at the time when a second read operation is simplified in the memory device according to the first embodiment.

DETAILED DESCRIPTION

In general, according to one embodiment, a memory device includes: a first wiring line extending in a first direction; a second wiring line extending in a second direction intersecting the first direction; a memory cell connected between the first wiring line and the second wiring line, and including a resistance change memory element to which a low-resistance state or a high-resistance state can be set, and a switching element connected in series to the resistance change memory element; and a determination circuit determining a determination object resistance state set in advance to the resistance change memory element, wherein the switching element possesses characteristics that when a voltage applied between two terminals thereof increases to reach a first voltage, the switching element makes a transition from an off-state to an on-state and, when a voltage applied between the two terminals thereof decreases to reach a second voltage lower than the first voltage, the switching element makes a transition from the on-state to the off-state, and the determination circuit determines the determination object resistance state based on a determination object voltage which corresponds to a voltage difference between a base voltage and a voltage applied to the second wiring line when the switching element makes a transition from the on-state to the off-state.

Hereinafter, embodiments will be described with reference to the accompanying drawings.

Embodiment 1

Figure 1:
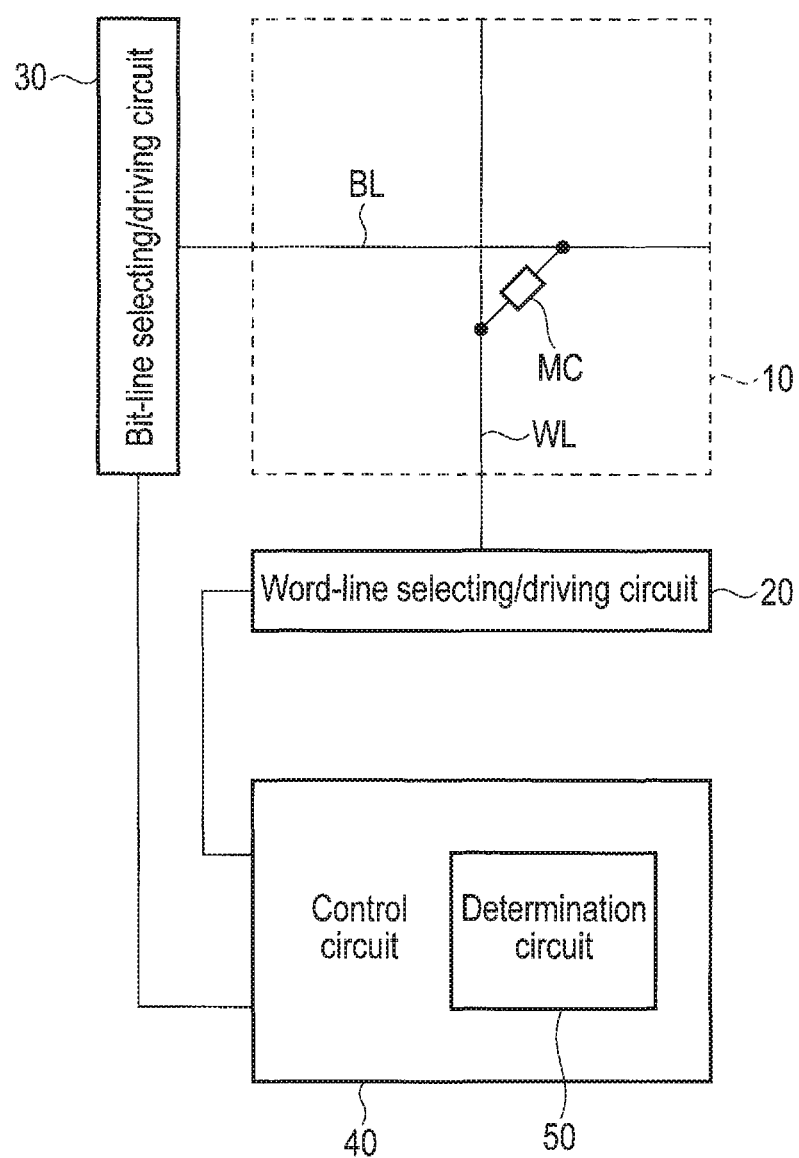
FIG. 1 is a view showing the overall configuration of a memory device according to a first embodiment.

FIG. 1 is a view showing the overall configuration of a memory device, i.e., a semiconductor integrated circuit device according to a first embodiment.

The memory device shown in FIG. 1 includes a memory cell array area 10, word-line selecting/driving circuit 20, bit-line selecting/driving circuit 30, and control circuit 40.

Figure 2:
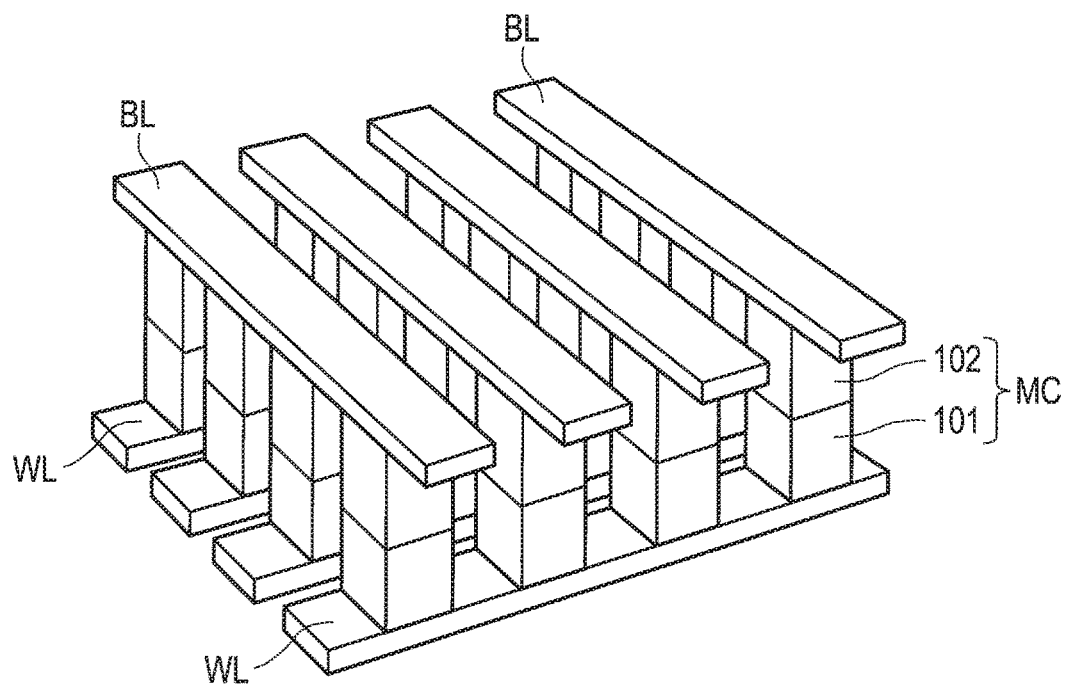
FIG. 2 is a bird's-eye view schematically showing an example of a fundamental configuration of a memory cell array area included in the memory device according to the first embodiment.

FIG. 2 is a bird's-eye view schematically showing the fundamental configuration of the above-mentioned memory cell array area 10.

As shown in FIG. 2, in the memory cell array area 10, a plurality of memory cells MC, a plurality of word lines (the word line corresponds to one of first wiring line and second wiring line) WL, and a plurality of bit lines (the bit line corresponds to the other one of the first wiring line and second wiring line) BL are provided. Each of the memory cells MC is connected between a corresponding word line WL and corresponding bit line BL. Applying a predetermined voltage between a word line WL connected to a targeted memory cell MC and bit line BL connected to the targeted memory cell MC to thereby cause a predetermined current to flow through the targeted memory cell MC makes it possible to carry out write/read to/from the targeted memory cell MC. In each of the memory cells MC, a nonvolatile resistance change memory element 101 to which a low-resistance state or high-resistance state can be set, and selector (two-terminal switching element) 102 connected in series to the resistance change memory element 101 are included.

Figure 3:
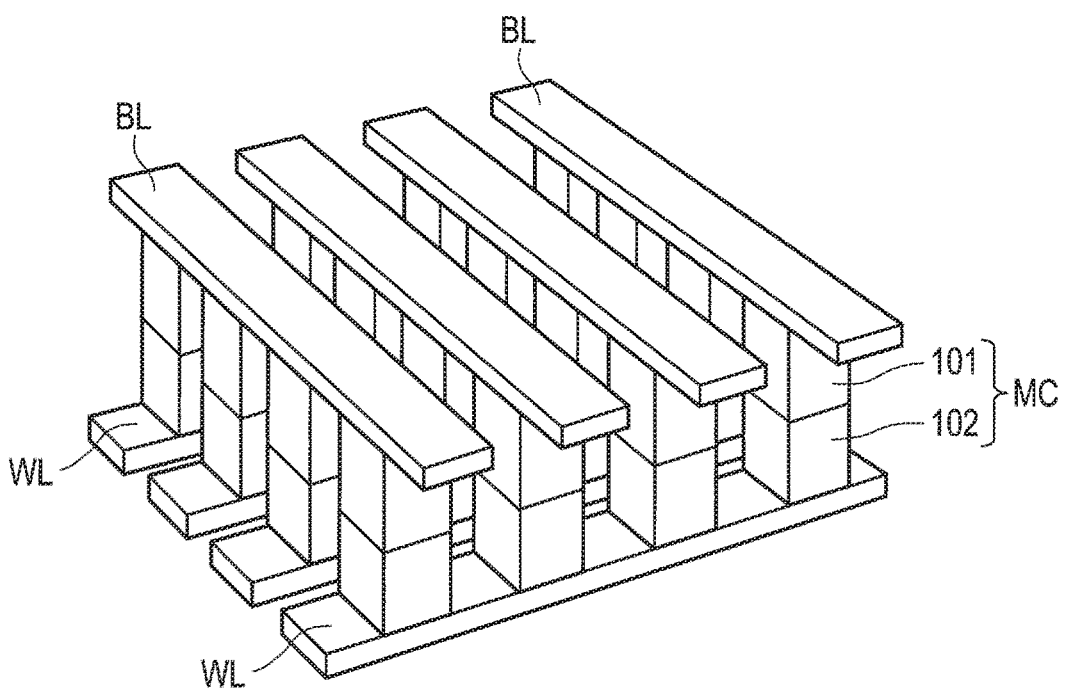
FIG. 3 is a bird's-eye view schematically showing another example of the fundamental configuration of the memory cell array area included in the memory device according to the first embodiment.

It should be noted that in the example shown in FIG. 2, although the selector 102 is provided on the upper-layer side of the resistance change memory element 101, the selector 102 may also be provided on the lower-layer side of the resistance change memory element 101 as shown in FIG. 3.

Further, in the examples shown in FIG. 2 and FIG. 3, although the bit line BL is provided on the upper-layer side of the word line WL, the bit line BL may also be provided on the lower-layer side of the word line WL.

Figure 4:
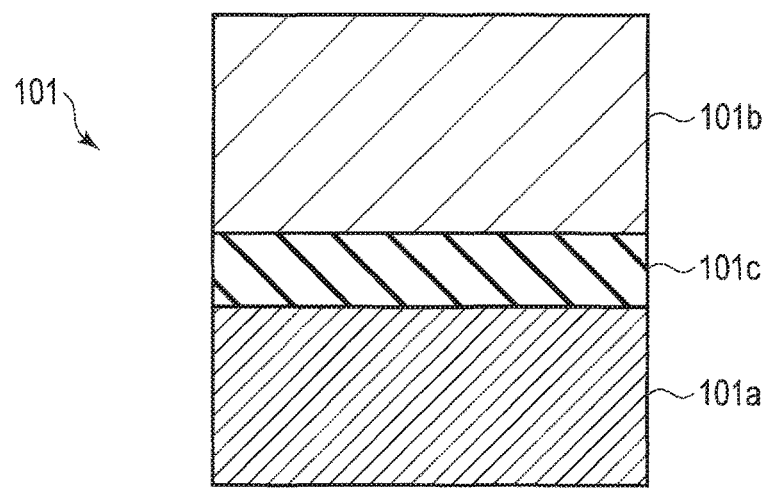
FIG. 4 is a cross-sectional view schematically showing a configuration example a resistance change memory element included in the memory device according to the first embodiment.

FIG. 4 is a cross-sectional view schematically showing a configuration example of the nonvolatile resistance change memory element 101 included in the memory cell MC. In this embodiment, a magnetoresistive element is used as the nonvolatile resistance change memory element 101. It should be noted that the magnetoresistive element is also called a magnetic tunnel junction (MTJ) element.

As shown in FIG. 4, the magnetoresistive element (resistance change memory element 101) includes a storage layer (first magnetic layer) 101a, reference layer (second magnetic layer) 101b, and tunnel barrier layer (nonmagnetic layer) 101c provided between the storage layer 101a and reference layer 101b.

The storage layer 101a is formed of a ferromagnetic layer having a variable magnetization direction. The reference layer 101b is formed of a ferromagnetic layer having a fixed magnetization direction. The tunnel barrier layer 101c is a nonmagnetic layer formed of an insulating material. It should be noted that the variable magnetization direction implies a magnetization direction variable with respect to a predetermined write current, and fixed magnetization direction implies a magnetization direction invariable with respect to the predetermined write current.

When the magnetization direction of the storage layer 101a is parallel to the magnetization direction of the reference layer 101b, the magnetoresistive element enters the low-resistance state and, when the magnetization direction of the storage layer 101a is antiparallel to the magnetization direction of the reference layer 101b, the magnetoresistive element enters the high-resistance state. Accordingly, the magnetoresistive element can memorize binary data according to the resistance state (low-resistance state, high-resistance state). Further, the resistance state (low-resistance state, high-resistance state) of the magnetoresistive element can be set according to the direction of the write current flowing through the magnetoresistive element. That is, different resistance states are set in the case where the current flows from the storage layer 101a to the reference layer 101b, and case where the current flows from the reference layer 101b to the storage layer 101a.

It should be noted that although the example shown in FIG. 4 is the bottom-free magnetoresistive element in which the storage layer 101a is positioned on the lower-layer side of reference layer 101b, the top-free magnetoresistive element in which the storage layer 101a is positioned on the upper-layer side of the reference layer 101b may also be used. Further, in the magnetoresistive element, a shift-canceling layer configured to cancel the magnetic field to be applied from the reference layer 101b to the storage layer 101a may further be provided.

Figure 5:
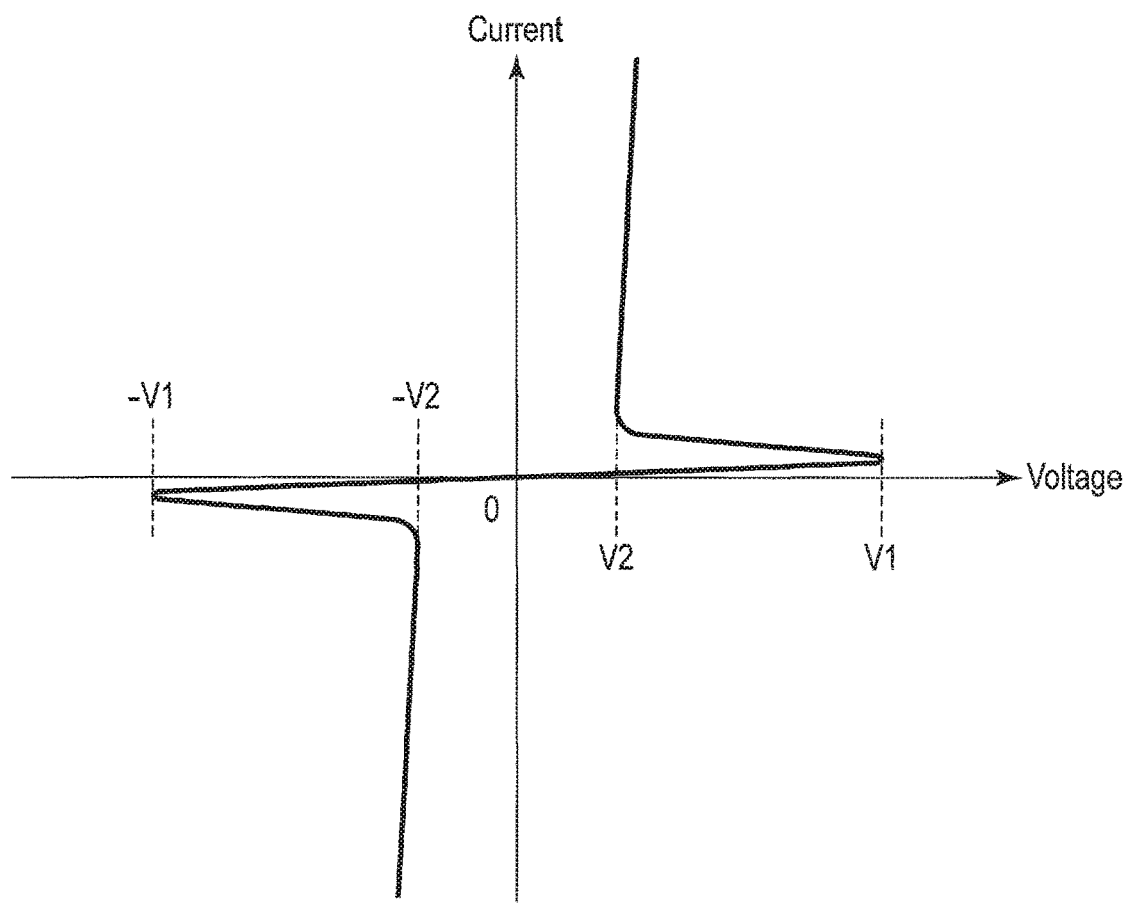
FIG. 5 is a view schematically showing the current-voltage characteristics of a selector included in the memory device according to the first embodiment.

FIG. 5 is a view schematically showing the current-voltage characteristics of the selector (two-terminal switching element) 102 included in the memory cell MC.

As shown in FIG. 5, the selector (two-terminal switching element) 102 has the characteristics that when the voltage applied between the two terminals increases to reach a first voltage V1 (on-voltage), the selector 102 makes a transition from the off-state to the on-state and, when the selector enters the on-state, the voltage across the two terminals makes a transition from the first voltage V1 to a second voltage V2 lower than the first voltage V1 and the current abruptly increases. Further, the selector 102 has the characteristics that when the voltage applied between the two terminals decreases to reach the second voltage V2 (off-voltage), the selector 102 makes a transition from the on-state to the off-state. That is, when making a transition from the off-state to the on-state, although selector 102 follows the negative resistance area between the voltage V1 and voltage V2, when making a transition from the on-state to the off-state, the selector 102 makes the transition to the off-state without following the negative resistance area.

Further, as shown in FIG. 5, the selector 102 has the current-voltage characteristics symmetrical with respect to both the directions (positive direction and negative direction).

By applying a predetermined voltage between the word line WL and bit line BL to make the selector 102 enter the on-state, it becomes possible to carry out write/read to/from the resistance change memory element 101.

Returning to the description of FIG. 1, the word-line selecting/driving circuit 20 is a circuit configured to select/drive the word line WL connected to the targeted memory cell MC, and bit-line selecting/driving circuit 30 is a circuit configured to select/drive the bit line BL connected to the targeted memory cell MC. Applying a voltage between the selected word line WL and selected bit line BL to thereby cause a predetermined current to flow makes it possible to carry out write/read to/from the targeted memory cell MC.

The control circuit 40 is a circuit configured to carry out various types of control including control of the word-line selecting/driving circuit 20 and bit-line selecting/driving circuit 30, and includes a determination circuit 50.

The determination circuit 50 is a circuit configured to determine the determination object resistance state (low-resistance state or high-resistance state) set in advance to the resistance change memory element 101. On the basis of the determination object resistance state, the binary data stored in the resistance change memory element 101 is determined. More specifically, the determination circuit 50 determines the determination object resistance state set in advance to the resistance change memory element 101 on the basis of a determination object voltage applied between the word line WL and bit line BL when the selector (two-terminal switching element) 102 has made a transition from the on-state to the off-state. Hereinafter, a determination operation to be carried out by the determination circuit 50 will be described in detail.

FIG. 6 is a view schematically showing the current-voltage characteristics at the time of read of the selected memory cell MC. That is, in FIG. 6, the axis of abscissas indicates a voltage (voltage applied between the word line WL and bit line BL) across both ends of the selected memory cell MC, and axis of ordinates indicates a current flowing through the selected memory cell MC. The characteristics (L) are the characteristics at the time when the resistance change memory element 101 is set to the low-resistance state, and characteristics (H) are the characteristics at the time when the resistance change memory element 101 is set to the high-resistance state. It should be noted that in both the characteristics (L) and characteristics (H), the characteristics parts (c) indicated by broken lines are virtual characteristics parts not actually appearing.

In general, in the memory cell MC including the resistance change memory element 101, the off resistance (resistance at the time of the off-state) of the selector 102 is sufficiently greater than the resistance (resistance at the time of the low-resistance state, resistance at the time of the high-resistance state) of the resistance change memory element 101. Accordingly, the current-voltage characteristics (corresponding to the characteristics part (a)) of the memory cell MC to be observed within a range of the transition made by the selector 102 from the off-state to the on-state are substantially identical in both the case where the resistance change memory element 101 is set to the low-resistance state and case where the resistance change memory element 101 is set to the high-resistance state. That is, the voltage (threshold voltage Vth) applied between both the ends of the memory cell MC at the time when the selector 102 makes a transition from the off-state to the on-state is substantially identical in both the case where the selector 102 is set to the low-resistance state and case where the selector 102 is set to the high-resistance state.

On the other hand, after the selector makes the transition from the off-state to the on-state, the current-voltage characteristics of the memory cell MC differ between the case where the resistance change memory element 101 is in the low-resistance state and case where the resistance change memory element 101 is in the high-resistance state. Accordingly, when a read current Iread is supplied to the memory cell MC, a voltage difference is caused between the voltage across both the ends of the memory cell MC of the case where the resistance change memory element 101 is in the low-resistance state and voltage across both the ends of the memory cell MC of the case where the resistance change memory element 101 is in the high-resistance state. It is possible to determine the resistance state (low-resistance state, high-resistance state) of the resistance change memory element 101 on the basis of the above-mentioned voltage difference.

When the read current Iread is greater than the hold current Ihold, although a large problem is not caused, when the read current Iread is less than the hold current Ihold, there is a possibility of a large problem being caused. Accordingly, it is important to resolve such a problem.

It should be noted that the hold current Ihold is a current flowing through the memory cell MC when the selector 102 makes a transition from the on-state to the off-state. Further, the voltage applied to the memory cell MC when the selector 102 makes the transition from the on-state to the off-state is defined as the hold voltage Vhold. That is, the voltage corresponding to the hold current Ihold is defined as the hold voltage Vhold. Further, the hold voltage of the case where the resistance change memory element 101 is in the low-resistance state is defined as the hold voltage Vholdl and, hold voltage of the case where the resistance change memory element 101 is in the high-resistance state is defined as the hold voltage Vholdh.

In the case where the read current Iread is less than the hold current Ihold, when the selector 102 makes a transition from the on-state to the off-state, the current-voltage characteristics of the memory cell MC do not move from the characteristics (b) to the characteristics (c), but moves to the characteristics (a). The read current Iread is kept supplied to the memory cell MC, and hence there is a possibility of a phenomenon in which the voltage of the memory cell MC rises to the threshold voltage Vth according to the characteristics (a), and thereafter makes a transition again to the hold voltage Vhold occurring in the memory cell MC. As a result, there is a possibility of a phenomenon in which the threshold voltage Vth and hold voltage Vhold are alternately and repetitively applied to the memory cell MC, whereby the voltage applied to the memory cell MC oscillates occurring. When such a phenomenon occurs, it becomes impossible to carry out stable read.

Accordingly, in this embodiment, the determination object resistance state (low-resistance state or high-resistance state) set in advance to the resistance change memory element 101 is determined in the following manner.

FIG. 7 is a block diagram showing the functional configuration of the determination circuit 50 by which a determination operation is carried out. Each of FIGS. 8A to 8K is a view showing a voltage acquisition operation necessary for the determination operation. The voltage acquisition operation is carried out by the control circuit 40 including the determination circuit 50 shown in FIG. 1.

In the voltage acquisition operation shown in FIGS. 8A to 8K, broadly speaking, a first read operation (operation shown in FIGS. 8A to 8E), and second read operation to be carried out after the first read operation (operation shown in FIGS. 8G to 8K) are included.

Figure 8A:
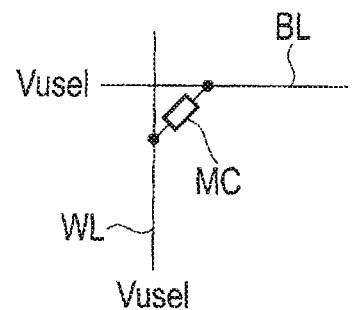
FIG. 8A, FIG. 8B, FIG. 8C, FIG. 8D, FIG. 8E, FIG. 8F, FIG. 8G, FIG. 8H, FIG. 8I, FIG. 8J, and FIG. 8K are views showing voltage acquisition operations necessary for a determination operation in the memory device according to the first embodiment.

First, as shown in FIG. 8A, the same voltage Vusel is applied to the word line WL and bit line BL. The voltage Vusel is about half the above-mentioned threshold voltage Vth. At this time, the voltage to be applied to the memory cell MC is 0 (zero) V.

Figure 8B:
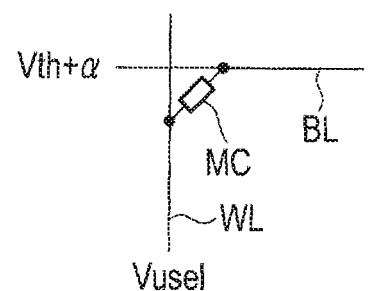

Next, as shown in FIG. 8B, a voltage (Vth+α) a little higher than the threshold voltage Vth is applied to the bit line BL. To the word line WL, the voltage Vusel identical to the applied voltage of FIG. 8A is continuously applied.

Figure 8C:
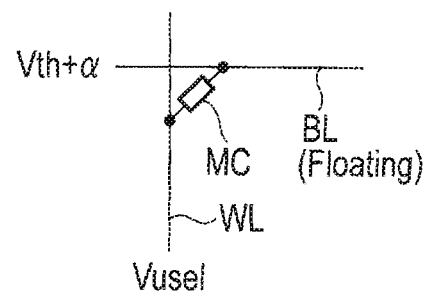

Next, as shown in FIG. 8C, the bit line BL is set in the floating state. Being in the floating state, the voltage of the bit line BL is maintained at (Vth+α). Further, the applied voltage of the word line WL is maintained at Vusel.

Figure 8D:
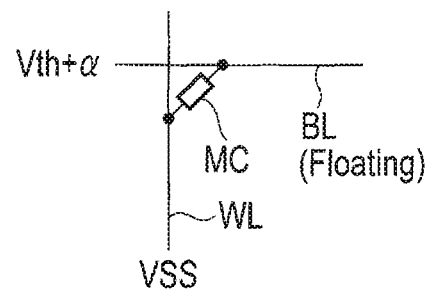

Next, as shown in FIG. 8D, a voltage VSS (for example, the ground voltage) is applied to the word line WL in the state where the bit line BL is maintained in the floating state. Thereby, the voltage (Vth+α) higher than the threshold voltage is applied between the word line WL and bit line BL. As a result, the voltage (Vth+α) is applied to the memory cell MC and the selector 102 in the memory cell MC makes a transition from the off-state to the on-state.

When the selector 102 makes the transition from the off-state to the on-state, a current flows from the bit line BL to the word line WL through the memory cell MC. At this time, the bit line BL is maintained in the floating state, and hence the electric potential of the bit line BL automatically and gradually lowers.

Figure 8E:
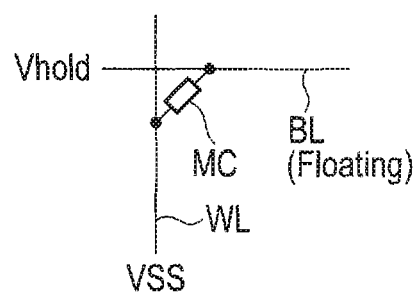

As a result, the electric potential of the bit line BL reaches the hold voltage Vhold (Vholdl or Vholdh shown in FIG. 6) as shown in FIG. 8E. That is, the voltage (voltage difference) between the word line WL and bit line BL becomes the hold voltage Vhold, and voltage across both the ends of the memory cell MC becomes the hold voltage Vhold. As already described above, when the voltage across both the ends of the memory cell MC becomes the hold voltage Vhold, the selector 102 makes a transition from the on-state to the off-state. For this reason, a state where no current flows through the memory cell MC is brought about, and the voltage across both the ends of the memory cell MC is maintained at the hold voltage Vhold. That is, the electric potential of the bit line BL is maintained at the hold voltage Vhold. When the determination object resistance state set to the resistance change memory element 101 in the memory cell MC is the low-resistance state, the hold voltage is Vholdl (see FIG. 6) and, when the determination object resistance state set to the resistance change memory element 101 in the memory cell MC is the high-resistance state, the hold voltage is Vholdh (see FIG. 6). The determination circuit 50 detects the hold voltage (Vholdl or Vholdh) at this time as the determination object voltage and stores the voltage in a voltage storing section 51.

Figure 8F:
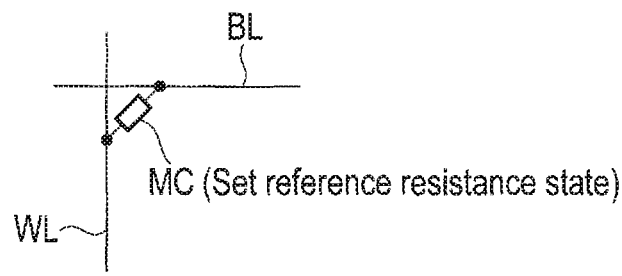

After the determination object voltage is acquired by the first read operation in the manner described above, one of the low-resistance state and high-resistance state is set to the resistance change memory element 101 in the memory cell MC as a reference resistance state as shown in FIG. 8F. That is, one of the low-resistance state and high-resistance state is written to the resistance change memory element 101 as the reference resistance state. More specifically, by applying a predetermined voltage between the word line WL and bit line BL to cause the selector 102 to make a transition from the off-state to the on-state, and by causing a predetermined write current to flow through the resistance change memory element 101, the reference resistance state is set to the resistance change memory element 101.

After the reference resistance state is set to the resistance change memory element 101 in this manner, the second read operation shown in FIGS. 8G to 8K is carried out.

The fundamental sequence of the second read operation is identical to the first read operation described above, and the sequence of FIGS. 8G to 8K is carried out in the same manner as the sequence of FIGS. 8A to 8E.

Figure 8G:
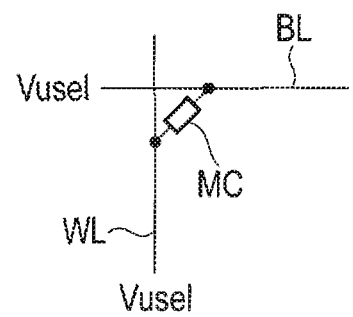
Figure 8H:
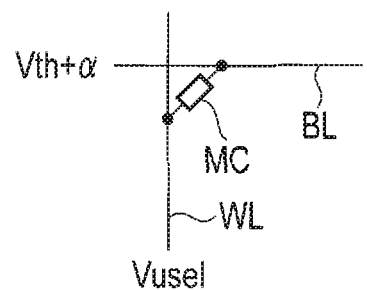
Figure 8I:
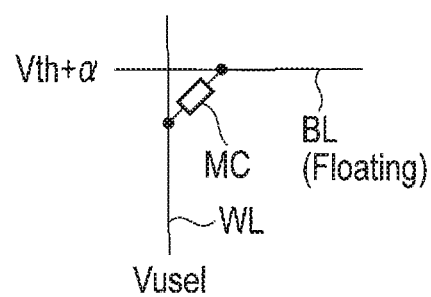
Figure 8J:
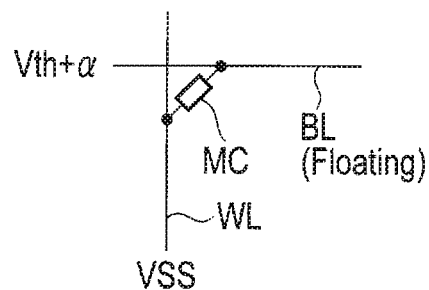

That is, in the step of FIG. 8G, the same voltage Vusel is applied to the word line WL and bit line BL. In the step of FIG. 8H, the voltage (Vth+α) is applied to the bit line BL. In the step of FIG. 8I, the bit line BL is set in the floating state. In the step of FIG. 8J, the voltage VSS is applied to the word line WL in the state where the bit line BL is maintained in the floating state. Thereby, the voltage (Vth+α) is applied to the memory cell MC, and the selector 102 in the memory cell MC makes a transition from the off-state to the on-state.

Figure 8K:
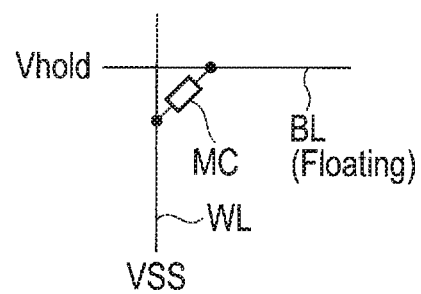

As a result, the electric potential of the bit line BL automatically and gradually lowers and, in the step of FIG. 8K, the electric potential of the bit line BL reaches the hold voltage Vhold (Vholdl or Vholdh). That is, the voltage between the word line WL and bit line BL becomes the hold voltage Vhold, and voltage across both the ends of the memory cell MC becomes the hold voltage Vhold. Thereby, the selector 102 makes a transition from the on-state to the off-state, and voltage across both the ends of the memory cell MC is maintained at the hold voltage Vhold. At this time, when the reference resistance state set to the resistance change memory element 101 in the step of FIG. 8F is the low-resistance state, the hold voltage becomes Vholdl and, when the reference resistance state set to the resistance change memory element 101 in the step of FIG. 8F is the high-resistance state, the hold voltage becomes Vholdh. The determination circuit 50 detects the hold voltage (Vholdl or Vholdh) at this time as the reference voltage and stores the voltage in the voltage storing section 51.

In the manner described above, the reference voltage is acquired by the second read operation.

In the determination circuit 50, the determination object resistance state set in advance to the resistance change memory element 101 is determined on the basis of the determination object voltage acquired by the first read operation and reference voltage acquired by the second read operation. That is, the binary data stored in the resistance change memory element 101 is determined. More specifically, the above-mentioned operation is carried out in the following manner.

First, a voltage difference between the determination object voltage and reference voltage is acquired by a voltage difference acquiring section 52 in the determination circuit 50. The voltage difference is compared with a reference voltage difference by a comparing section 53 in the determination circuit 50. In a determining section 54 in the determination circuit 50, the determination object resistance state of the resistance change memory element 101 is determined on the basis of the comparison result acquired by the comparing section 53. More specifically, when the voltage difference between the determination object voltage and reference voltage is less than the reference voltage difference, it is determined that the determination object resistance state of the resistance change memory element 101 is the resistance state identical to the reference resistance state and, when the voltage difference between the determination object voltage and reference voltage is greater than the reference voltage difference, it is determined that the determination object resistance state of the resistance change memory element 101 is the resistance state different from the reference resistance state. Hereinafter, a description of the above will be given.

The first read operation and second read operation are carried out on the same memory cell MC, and the determination object voltage and reference voltage are voltages acquired with respect to the same memory cell MC. Accordingly, when the determination object resistance state is a resistance state identical to the reference resistance state, it is conceivable that the determination object voltage becomes a voltage identical to the reference voltage. Thus, when the voltage difference between the determination object voltage and reference voltage is less than the reference voltage difference, it is determined that the determination object resistance state of the resistance change memory element 101 is the resistance state identical to the reference resistance state and, when the voltage difference between the determination object voltage and reference voltage is greater than the reference voltage difference, it is determined that the determination object resistance state of the resistance change memory element 101 is the resistance state different from the reference resistance state. For example, when the reference resistance state is the low-resistance state, if the voltage difference is less than the reference voltage difference, it is determined that the determination object resistance state is the low-resistance state and, if the voltage difference is greater than the reference voltage difference, it is determined that the determination object resistance state is the high-resistance state. When the reference resistance state is the high-resistance state, if the voltage difference is less than the reference voltage difference, it is determined that the determination object resistance state is the high-resistance state and, if the voltage difference is greater than the reference voltage difference, it is determined that the determination object resistance state is the low-resistance state.

Here, it is assumed that the hold voltage (corresponding to the determination object voltage) acquired by the first read operation is Vhold1, and hold voltage (corresponding to the reference voltage) acquired by the second read operation is Vhold2. Further, it is assumed that the resistance value of the memory cell MC at the time of the first read operation is Rcell, resistance value of the memory cell MC at the time when the resistance change memory element 101 is in the low-resistance state is Rl, resistance value of the memory cell MC at the time when the resistance change memory element 101 is in the high-resistance state is Rh, and value of the path resistance is Rpath. Further, it is assumed that the reference resistance state of resistance change memory element 101 at the time of the second read operation is the low-resistance state.

In this case, the following relational expressions are established.

$$V\text{hold1} = I\text{hold} \times (R\text{cell} + R\text{path})$$

$$V\text{hold2} = I\text{hold} \times (Rl + R\text{path})$$

Here, assuming that the voltage difference between the hold voltage Vhold1 and hold voltage Vhold2 is ΔV, the following relationship is obtained.

$$\Delta V = V\text{hold1} - V\text{hold2}$$

$$= I\text{hold} \times (R\text{cell} - Rl)$$

$$= I\text{hold} \times \Delta R$$

That is, the path resistance Rpath is eliminated (that is, the parasitic resistance and the like are eliminated), and a value based on the resistance difference ΔR between the cell resistance at the time of the first read operation and cell resistance at the time of the second read operation appears as the voltage difference ΔV.

Accordingly, at the time of the first read operation, when the resistance state (i.e., the determination object resistance state) of the resistance change memory element 101 is the low-resistance state, the resistance difference ΔR is 0 (zero) and, when the resistance state thereof is the high-resistance state, the resistance difference ΔR is (Rh−Rl). Thus, by setting Ihold×(Rh−Rl)/2 as the reference voltage difference, it is possible to appropriately determine the determination object resistance state.

As described above, in this embodiment, the determination object resistance state of the resistance change memory element 101 is determined on the basis of the determination object voltage applied between the word line WL and bit line BL when the selector 102 makes a transition from the on-state to the off-state. At the point in time when the selector 102 makes the transition from the on-state to the off-state, the hold current Ihold of FIG. 6 flows through the memory cell MC (series connection of the resistance change memory element 101 and selector 102). Accordingly, it is possible to prevent the problem (problem that the applied voltage of the memory cell MC oscillates, and the like) resulting from the use of the read current Iread less than the hold current Ihold from arising, and carry out stable read operations.

Further, in this embodiment, the determination object voltage is acquired in the state where the bit line BL is maintained in the floating state, whereby it is possible to automatically acquire the hold voltage Vhold as the determination object voltage. Accordingly, it is possible to easily and securely acquire the determination object voltage.

Further, in this embodiment, the first read operation and second read operation are carried out on the same memory cell MC, and the determination object voltage and reference voltage are acquired with respect to the same memory cell MC. That is, in this embodiment, the read operation is carried out by self-reference read. Accordingly, even when the characteristics of the resistance change memory elements vary in the chip, it is possible to securely carry out read.

Further, as already described previously, in the conventional general read operation, although there are many cases where the read current Iread is less than the hold current Ihold, in this embodiment, the reference voltage difference can be set as Ihold×(Rh−Rl/2), and hence it is also possible to make the determination signal amount at the time of determination of the determination object resistance state greater.

It should be noted that in the embodiment described above, when the direction of the write current in the write operation of FIG. 8F and direction of the read current in the second read operation of FIGS. 8G to 8K are identical to each other, and the write voltage Vwrite is greater than the voltage (Vth+α), it is possible to simplify the second read operation. More specifically, it is possible to omit the steps of FIGS. 8G to 8J. Hereinafter, a description of the above will be given.

In the write operation of FIG. 8F, the write voltage Vwrite is applied between the word line WL and bit line BL, and the selector 102 is in the on-state. In the state where this write voltage Vwrite is applied between the word line WL and bit line BL, when the bit line BL is brought into the floating state, the electric potential of the bit line BL automatically lowers as in the case of the operation described already. As a result, the voltage between the word line WL and bit line BL becomes the hold voltage Vhold as in the step of FIG. 8K. By using the hold voltage at this time as the reference voltage, it is possible to execute the operation identical to the embodiment described above, and simplify the second read operation.

FIG. 9 is a view showing a simulation result at the time when the second read operation is simplified. More specifically, the simulation result at the time when the low-resistance state is written to the resistance change memory element 101 as the reference resistance state during the write operation period between the first read operation period and second read operation period is shown with respect to both the case where the low-resistance state is set to the resistance change memory element 101 as the determination object resistance state and case where the high-resistance state is set to the resistance change memory element 101 as the determination object resistance state.

FIG. 9 (a) shows the substantial read period, and shows the period during which the word line WL is substantially active. FIG. 9 (b) shows the first read operation period, second read operation period, and write operation period (write operation period of the reference resistance state) between the first read operation period and second read operation period. FIG. 9 (c) shows the electric potential of the word line WL and electric potential (the solid line is the bit line electric potential at the time when the high-resistance state is set as the determination object resistance state, and broken line is the bit line electric potential at the time when the low-resistance state is set as the determination object resistance state) of the bit line BL. FIG. 9 (d) shows the current (the solid line is the current at the time when the high-resistance state is set as the determination object resistance state, and broken line is the current at the time when the low-resistance state is set as the determination object resistance state) flowing through the memory cell MC. FIG. 9 (e) shows the voltage (voltage of the sense node, the solid line is the voltage at the time when the high-resistance state is set as the determination object resistance state, broken line is the voltage at the time when the low-resistance state is set as the determination object resistance state, e1 is the determination object voltage obtained by the first read operation, and e2 is the reference voltage obtained by the second read operation on the basis of the write voltage e3) stored in the voltage storing section 51. FIG. 9 (f) shows the output data (corresponding to the output of the comparing section 53 or output of the determining section 54, the solid line is the output data at the time when the high-resistance state is set as the determination object resistance state, and broken line is the output data at the time when the low-resistance state is set as the determination object resistance state).

As shown in FIG. 9, when the selector 102 enters the on-state, the current flows through the memory cell MC as shown in FIG. 9 (d). When the bit line electric potential lowers and the selector 102 enters the off-state as shown in FIG. 9 (c), the state where the current does not flow through the memory cell MC is brought about as shown in FIG. 9 (d). As shown in FIG. 9 (e), the value of the determination object voltage differs between the case where the low-resistance state is set as the determination object resistance state (broken line of e1) and case where the high-resistance state is set as the determination object resistance state (solid line of e1). Further, FIG. 9 is the simulation result at the time when the low-resistance state is written as the reference resistance state, and hence as shown in FIG. 9 (e), when the low-resistance state is set as the determination object resistance state, although there is hardly any voltage difference ($\Delta V1$) between the determination object voltage and reference voltage, when the high-resistance state is set as the determination object resistance state, a great voltage difference ($\Delta V2$) is created between the determination object voltage and reference voltage.

It can be seen also from the simulation result described above that the determination method of this embodiment is effective.

Embodiment 2

Next, a memory device according to a second embodiment will be described below. It should be noted that the fundamental items are identical to the first embodiment, and hence descriptions of the items already described in the first embodiment are omitted.

In this embodiment, the determination object resistance state is determined by comparing the determination object voltage with a predetermined reference voltage by means of the determination circuit.

Figure 10:
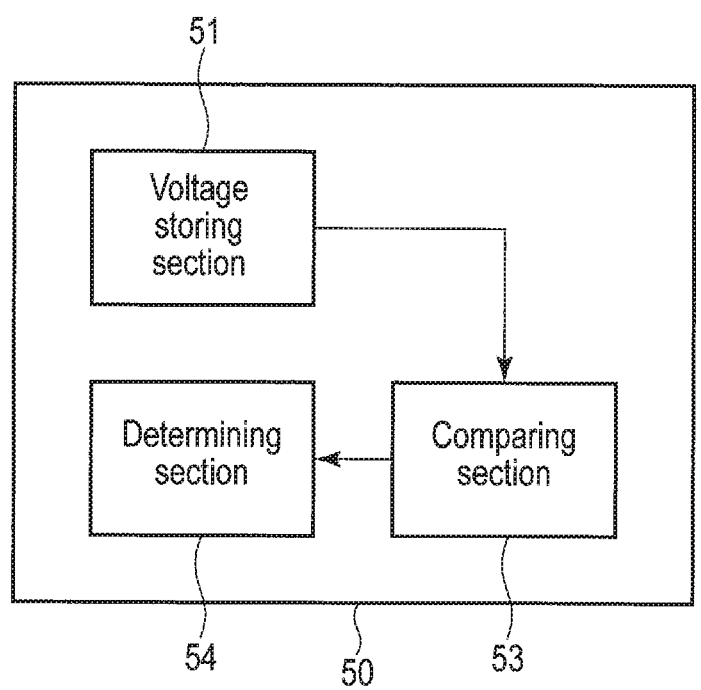
FIG. 10 is a block diagram showing the functional configuration of a determination circuit included in a memory device according to a second embodiment.

FIG. 10 is a block diagram showing the functional configuration of a determination circuit 50 of this embodiment.

In this embodiment, a predetermined reference voltage is stored in a voltage storing section 51. The reference voltage is greater than the hold voltage Vholdl shown in FIG. 6 and is less than the hold voltage Vholdh. That is, the reference voltage is greater than the hold voltage Vholdl applied between the word line WL and bit line BL in the case where the resistance change memory element 101 is set in the low-resistance state and, when the selector 102 makes a transition from the on-state to the off-state, and is less than the hold voltage Vholldh applied between the word line WL and bit line BL in the case where the resistance change memory element 101 is set in the high-resistance state and, when the selector 102 makes a transition from the on-state to the off-state.

The acquisition operation of the determination object voltage is identical to the first read operation shown in FIGS. 8A to 8E. By carrying out the read operation shown in FIGS. 8A to 8E in the same manner as the first embodiment, the hold voltage Vhold applied between the word line WL and bit line BL, i.e., across both the ends of the memory cell MC is acquired. The acquired hold voltage Vhold is stored in the voltage storing section 51 as the determination object voltage.

The determination object voltage stored in the voltage storing section 51 is compared with a predetermined reference voltage by the comparing section 53. That is, comparison is carried out by the comparing section 53 as to whether the determination object voltage is greater than the reference voltage or is less than the reference voltage. In the determining section 54, the determination object resistance state of the resistance change memory element 101 is determined on the basis of the comparison result obtained by the comparing section 53. More specifically, when the determination object voltage is less than the reference voltage, it is determined that the determination object resistance state is the low-resistance state and, when the determination object voltage is greater than the reference voltage, it is determined that the determination object resistance state is the high-resistance state.

As described above, in this embodiment too, the determination object voltage is acquired in the same manner as the first embodiment, and hence it is possible to prevent the problem that the applied voltage of the memory cell MC oscillates, and the like from arising as in the case of the first embodiment, and carry out stable read operations.

Further, in this embodiment, it is sufficient if the read operation is carried only once, and hence it is possible to realize simplification and speed-enhancement of the determination operation.

It should be noted that as described in the first embodiment, in general, the characteristics of the resistance change memory elements 101 vary in the chip. Accordingly, when the method of this embodiment is used, there is a possibility of the determination of the determination object resistance state being unable to be securely carried out unless the reference voltage is set to an appropriate value. However, if the variations in the characteristics of the resistance change memory element 101 can be suppressed, the method of this embodiment is effective for simplification, speed-enhancement, and the like of the determination operation.

It should be noted that in the first and second embodiments described above, although the magnetoresistive element is used as the resistance change memory element 101, it is also possible to use other resistance change memory elements such as a phase-change memory element (PCM element) and the like if only the elements are those configured to store data in them on the basis of the resistance state (low-resistance state, high-resistance state).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a first wiring line extending in a first direction;
a second wiring line extending in a second direction intersecting the first direction;
a memory cell connected between the first wiring line and the second wiring line, and including a resistance change memory element and a switching element connected in series to the resistance change memory element, the resistance change memory element being switchable between a low-resistance state and a high-resistance state; and
a determination circuit which determines a determination object resistance state set in advance to the resistance change memory element,
wherein the switching element possesses characteristics that when a voltage applied between two terminals thereof increases to a first voltage, the switching element makes a transition from an off-state to an on-state and, when a voltage applied between the two terminals thereof decreases to a second voltage lower than the first voltage, the switching element makes a transition from the on-state to the off-state, and
wherein the determination circuit comprises a voltage storing section which stores a determination object voltage which corresponds to a voltage difference between a base voltage and a voltage applied to the second wiring line when the switching element makes a transition from the on-state to the off-state, and a determining section which determines the determination object resistance state based on the determination object voltage.

2. The memory device of claim 1, wherein the base voltage corresponds to a voltage applied to the first wiring line when the switching element makes the transition from the on-state to the off-state.

3. The memory device of claim 1, wherein the determination object voltage corresponds to a voltage applied between the first wiring line and the second wiring line when the switching element makes the transition from the on-state to the off-state.

4. The memory device of claim 1, wherein when the determination circuit acquires the determination object voltage, the second wiring line is maintained in a floating state.

5. The memory device of claim 4, wherein before the determination circuit acquires the determination object voltage, a voltage higher than a predetermined threshold voltage is applied between the first wiring line and the second wiring line in a state where the second wiring line is maintained in the floating state, whereby the switching element makes a transition from the off-state to the on-state.

6. The memory device of claim 5, wherein after the switching element makes the transition from the off-state to the on-state, the voltage applied to the second wiring line decreases to the determination object voltage.

7. The memory device of claim 1, wherein a voltage applied between the first wiring line and the second wiring line at a time when the switching element makes the transition from the off-state to the on-state is substantially identical in both a case where the resistance change memory element is set in the low-resistance state and a case where the resistance change memory element is set in the high-resistance state.

8. The memory device of claim 1, wherein:
  after the determination object voltage is acquired, one of the low-resistance state and the high-resistance state is set to the resistance change memory element as a reference resistance state,
  the voltage storing section stores, in a state where the reference resistance state is set to the resistance change memory element, a voltage applied to the second wiring line when the switching element makes the transition from the on-state to the off-state as a reference voltage, and
  the determining section determines the determination object resistance state based on the determination object voltage and the reference voltage.

9. The memory device of claim 8, wherein the determining section determines the determination object resistance state by comparing a voltage difference between the determination object voltage and the reference voltage with a reference voltage difference.

10. The memory device of claim 9, wherein when the voltage difference is less than the reference voltage difference, the determining section determines that the determination object resistance state is a resistance state identical to the reference resistance state.

11. The memory device of claim 8, wherein:
  the second wiring line makes a transition to the floating state in a state where the voltage at a time when the reference resistance state is set to the resistance change memory element is applied between the first wiring line and the second wiring line, and
  the voltage storing section stores, as the reference voltage, a voltage applied to the second wiring line at a time when the switching element makes a transition from the on-state to the off-state in a state where the second wiring line is maintained in the floating state.

12. The memory device of claim 1, wherein the determining section determines the determination object resistance state by comparing the determination object voltage with a reference voltage.

13. The memory device of claim 12, wherein the determining section determines, when the determination object voltage is less than the reference voltage, that the determination object resistance state is the low-resistance state and determines, when the determination object voltage is greater than the reference voltage, that the determination object resistance state is the high-resistance state.

14. The memory device of claim 12, wherein the reference voltage is greater than a voltage applied to the second wiring line at a time when the switching element makes a transition from the on-state to the off-state in a case where the resistance change memory element is set in the low-resistance state, and is less than a voltage applied to the second wiring line at a time when the switching element makes a transition from the on-state to the off-state in a case where the resistance change memory element is set in the high-resistance state.

15. The memory device of claim 1, wherein the resistance change memory element is a magnetoresistive element.

16. The memory device of claim 1, wherein the switching element is a two-terminal switching element.

17. The memory device of claim 16, wherein the switching element is connected in one of two following forms:
  (i) one of the two terminals of the switching element is connected to the resistance change memory element and the other one of the two terminals of the switching element is connected to the first wiring, and
  (ii) one of the two terminals of the switching element is connected to the resistance change memory element and the other one of the two terminals of the switching element is connected to the second wiring.

18. The memory device of claim 1, wherein:
  the determination circuit further comprises a voltage difference acquiring section which acquires a voltage difference between the determination object voltage and a reference voltage, and a comparing section which compares the voltage difference with a reference voltage difference, and
  the determining section determines the determination object resistance state based on a comparison result acquired by the comparing section.

19. The memory device of claim 1, wherein:
  the determination circuit further comprises a comparing section which compares the determination object voltage with a reference voltage, and
  the determining section determines the determination object resistance state based on a comparison result acquired by the comparing section.

* * * * *